(12) United States Patent
Lee et al.

(10) Patent No.: US 10,727,834 B2
(45) Date of Patent: Jul. 28, 2020

(54) LEVEL SHIFTER IN HALF BRIDGE GAN DRIVER APPLICATIONS

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/654,209

(22) Filed: Oct. 16, 2019

(65) Prior Publication Data

US 2020/0127663 A1 Apr. 23, 2020

Related U.S. Application Data

(60) Provisional application No. 62/746,815, filed on Oct. 17, 2018.

(51) Int. Cl.
*H03K 19/0185* (2006.01)
(52) U.S. Cl.
CPC ......... *H03K 19/018521* (2013.01); *H03K 19/018507* (2013.01)
(58) Field of Classification Search
CPC .............. H03K 19/018507; H03K 19/018521
See application file for complete search history.

(56) References Cited

U.S. PATENT DOCUMENTS

| 6,353,345 | B1 | 3/2002 | Yushan et al. |
| 6,967,518 | B2* | 11/2005 | Giacomini ..... H03K 19/018557 326/80 |
| 9,264,022 | B2* | 2/2016 | Kihara ................. H03K 3/356 |
| 9,324,399 | B2 | 4/2016 | Pasotti et al. |
| 9,401,612 | B2* | 7/2016 | Kinzer .................. H01L 23/528 |
| 9,571,093 | B2* | 2/2017 | Kinzer ................ H03K 17/687 |
| 9,722,609 | B2 | 8/2017 | Kinzer et al. |
| 2008/0231321 | A1 | 9/2008 | Herzer et al. |
| 2011/0175649 | A1 | 7/2011 | Wadekar et al. |
| 2012/0182060 | A1 | 7/2012 | Rana |

(Continued)

FOREIGN PATENT DOCUMENTS

TW 201401775 A 1/2014

*Primary Examiner* — Patrick O Neill
(74) *Attorney, Agent, or Firm* — Blank Rome LLP

(57) ABSTRACT

A direct-coupled level shifter to level shift a ground referenced input logic signal to an output logic signal that can have either a positive or negative reference. The level shifter includes two level shift drivers, each of which includes a positive level shift driver and a negative level shift driver. The positive level shift drivers operate when the reference of the latch is above ground and turn off when the reference is below ground. Similarly, the negative level shift drivers operate when the reference is below ground and turn off when the reference is above ground. The output logic signal is based on the output from the positive level shift driver receiving the input signal and the output from the negative level shift driver receiving an inverse of the input signal. The inverse of the output logic signal is based on the output from the positive level shift driver receiving an inverse of the input signal and the output from the negative level shift driver receiving the input signal.

15 Claims, 8 Drawing Sheets

(56) References Cited

U.S. PATENT DOCUMENTS

2014/0354342 A1 12/2014 Lou
2015/0138867 A1 5/2015 Kirihata et al.
2016/0308515 A1 10/2016 Wang

* cited by examiner

LEVEL SHIFTER IN HALF BRIDGE GAN DRIVER APPLICATIONS

This application claims the benefit of U.S. Provisional Application No. 62/746,815, filed on Oct. 17, 2018, the entire disclosure of which is hereby incorporated by reference.

BACKGROUND

1. Field of the Invention

The present invention relates generally to level shifters for gate drivers configured to drive high side gallium nitride (GaN) field effect transistors (FETs) in half bridge circuits, and more particularly to a level shifter for generating a floating level control signal from both positive and negative reference voltages.

2. Description of the Related Art

In typical half bridge circuits, the on or off state of the high side transistor is determined by a ground-referenced control signal. However, the voltage on the source terminal of the high side transistor increases while the high side transistor is turned on and becomes the reference voltage for the high side signal path. To compensate for the shift in reference voltage, a level shifter shifts the ground-referenced control signal into a signal referenced from the changing voltage on the source terminal of the high side transistor. The level shifted control signal is provided to the high side gate driver. However, in addition to the floating reference voltage requirements, the level shifter must also withstand negative voltage on the source terminal of the high side transistor due to current commutation through the corresponding low side transistor.

FIG. 1 illustrates a schematic of a half bridge integrated circuit. In FIG. 1, half bridge circuit 100 includes a high side transistor 150 and a low side transistor 170 which control the voltage $V_{155}$ on node 155 and, by extension, the current to load 195 through inductor 185. A control signal CTL 110 is indicative of whether high side transistor 150 should be turned on or off, and a control signal CTL 115 is indicative of whether low side transistor 170 should be turned on or off. Gate driver 160 receives CTL 115 and drives the gate terminal of low side transistor 170 accordingly, using the supply voltage $V_{DD}$, the voltage of which is chosen to be less than the maximum gate to source voltage $V_{GS}$ for transistors 150 and 170. Because the source terminal of low side transistor 170 is connected to ground 105, gate driver 160 can use the ground-referenced CTL 115 directly.

In contrast, $V_{155}$ increases when high side transistor 150 turns on, changing the reference voltage for the high side signal path. Gate driver 140 must increase the driving voltage for transistor 150 as the voltage on its source terminal increases in order to keep high side transistor 150 turned on. Level shifter 125 must convert the ground-referenced CTL 110 into a $V_{155}$ referenced control signal. Level shifter 125 receives CTL 110 and generates an intermediate control signal ICTL 130 for gate driver 140 based on $V_{155}$ and the floating supply voltage $V_{DDF}$, which is approximately $V_{DD}-V_{120}+V_{IN}$, where $V_{120}$ represents the voltage across diode 120 and $V_{IN}$ represents the input voltage applied to the drain terminal of high side transistor 150. If high side transistor 150 turns off before low side transistor 170 is turned on, $V_{155}$ may decrease below ground due to commutation of the current through low side transistor 170. Thus, level shifter 125 must be able to level shift CTL 110 with reference to both positive and negative voltages on node 155.

FIG. 2 illustrates a schematic of a conventional direct-coupled level shifter for a gate driver associated with a high side transistor in a half bridge circuit. Conventional direct-coupled level shifter 200 is described herein with reference to half bridge circuit 100 shown in FIG. 1 for ease of illustration, and includes a pulse generator 210 which receives CTL 110 and generates a pulse on the gate terminal of either transistor 220 or transistor 230. The drain current through either transistor 220 or transistor 230 results in a voltage across either resistor 215 or 225, which sets the state of the set-reset (SR) flip-flop 250 after pulse filtering by pulse filter 240. Transistors 220 and 230 are chosen to withstand high voltages on their drain terminals.

If $V_{155}$ goes below ground by more than a threshold voltage $V_{TH}$, transistors 220 and 230 both turn on, even when the gate voltages for transistors 220 and 230 are at ground. The drain terminals of both transistors 220 and 230 are then shorted to ground, and conventional level shifter 200 may not function properly. Thus, conventional direct-coupled level shifter 200 cannot be used in place of level shifter 125 shown in half bridge circuit 100, since it cannot function properly in response to negative voltages on node 155.

FIG. 3 illustrates a schematic of a conventional capacitively coupled level shifter for a gate driver associated with a high side transistor in a half bridge circuit. Conventional capacitively coupled level shifter 300 is described herein with reference to half bridge circuit 100 shown in FIG. 1 for ease of illustration, and includes capacitors 310 and 320 which AC couple CTL 110 and its complement $\overline{CTL110}$ from inverter 305 to differential amplifier 340. Differential amplifier 340 amplifies the AC coupled signal to logic signal voltage levels, which sets the state of SR flip-flop 350. If $V_{155}$ decreases below ground, capacitors 310 and 320 prevent the DC voltage on node 155 from affecting operation of ground referenced circuits before conventional capacitively coupled level shifter 300 in the signal chain. Thus, conventional capacitively coupled level shifter 300 functions properly in response to both positive and negative voltages on node 155.

However, capacitors 310 and 320 must be high voltage capacitors, which may not be available or occupy a large area on the surface of a semiconductor die. Further, resistors 325 and 315 and the biasing voltage on node 330 must provide very large currents to capacitors 310 and 320 in response to fast, high voltage changes on node 155. Differential amplifier 340 must also be fast to reduce delay between a change in CTL 110 and high side transistor 150 turning on or off. The large currents for capacitors 310 and 320 and the speed of differential amplifier 340 increase the power consumption of conventional capacitively coupled level shifter 300 compared to conventional direct-coupled level shifter 200 shown in FIG. 2.

SUMMARY OF THE INVENTION

The present invention addresses the disadvantages of short circuits, high power consumption, and large area in conventional level shifters discussed above, by providing a direct-coupled level shifter for generating a level shifted control signal from a ground referenced input control signal. The present invention, as described herein, comprises two sets of level shift drivers, each contain a positive level shift driver and a negative level shift driver. The first set of level shift drivers generates a first output and comprises a positive level shift driver receiving the control signal and a negative level shift driver receiving the inverse of the control signal. The second set of level shift drivers generates a second output and comprises a positive level shift driver receiving the inverse of the control signal and a negative level shift driver receiving the control signal. The positive level shift drivers are ground referenced and operate when the reference voltage is above ground. The negative level shift drivers are referenced to both ground and the reference voltage, and operate when the reference voltage is below ground.

In a first embodiment, each positive level shift driver comprises a first set of at least one GaN FET configured as a diode and connected in series for receiving the reference voltage. A first resistor has a first terminal connected to the first set of GaN FETs and a second terminal connected to a node, and a second resistor has a first terminal connected to the node and a second terminal configured to receive a supply voltage. The first resistor and the first set of GaN FETs produce a voltage difference between the reference voltage and a voltage on the node that is sufficient to turn on a first GaN FET having a gate terminal connected to the node if the reference voltage is positive. A second GaN FET allows or blocks the first output based on the control signal or the second output based on the inverse of the control signal, respectively.

In a further embodiment, each negative level shift driver comprises a first GaN FET for allowing or blocking the first output based on the inverse of the control signal or the second output based on the control signal, respectively, and a logic level translator connected to the drain terminal of the first GaN FET and configured to receive the reference voltage, a first supply voltage and a second supply voltage. The second supply voltage is greater than or equal to the first supply voltage. The logic level translator is further connected to a node. The gate terminal of a second FET is connected to the node. The source terminal of the second GaN FET receives the reference voltage. The logic level translator produces a voltage difference between the reference voltage and a voltage on the node sufficient to turn on the second FET if the reference voltage is less than a predetermined voltage and based on the inverse of the control signal or the control signal, respectively.

A latch receives the reference voltage and the first output and provides the level shifted control signal based on the first output. The latch may also receive the second output and provide an inverse of the level shifted control signal. Alternatively, a pulse filter and an SR flip-flop can be used instead of the latch to provide the level shifted control signal (and optionally the inverse of the level shifted control signal).

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 1:
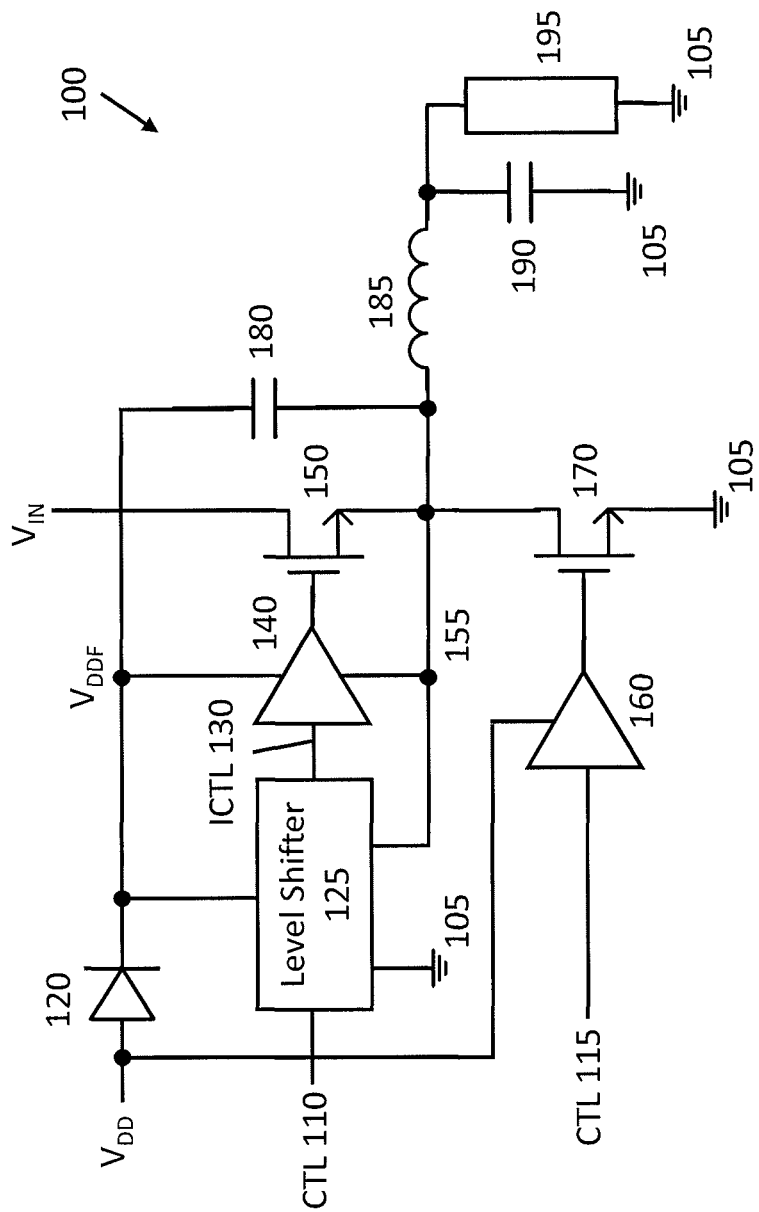
FIG. 1 illustrates a schematic of a conventional half bridge integrated circuit with a level shifter.
Figure 3:
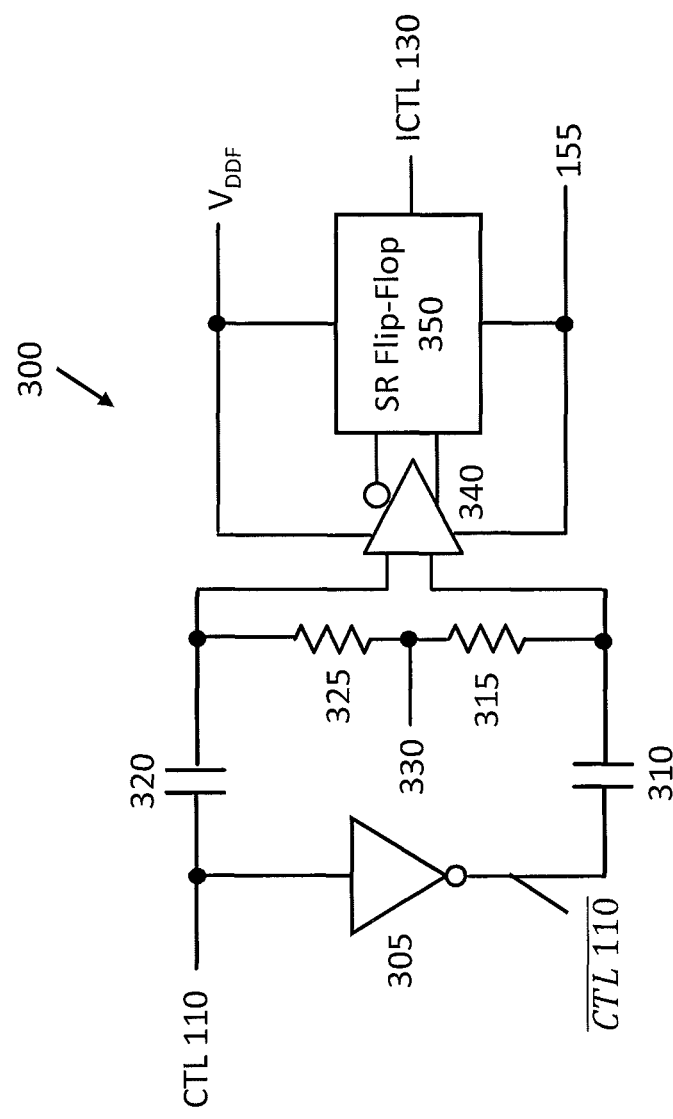
FIG. 3 illustrates a schematic of a conventional capacitively coupled level shifter for a gate driver associated with a high side transistor in a half bridge circuit.
Figure 4:
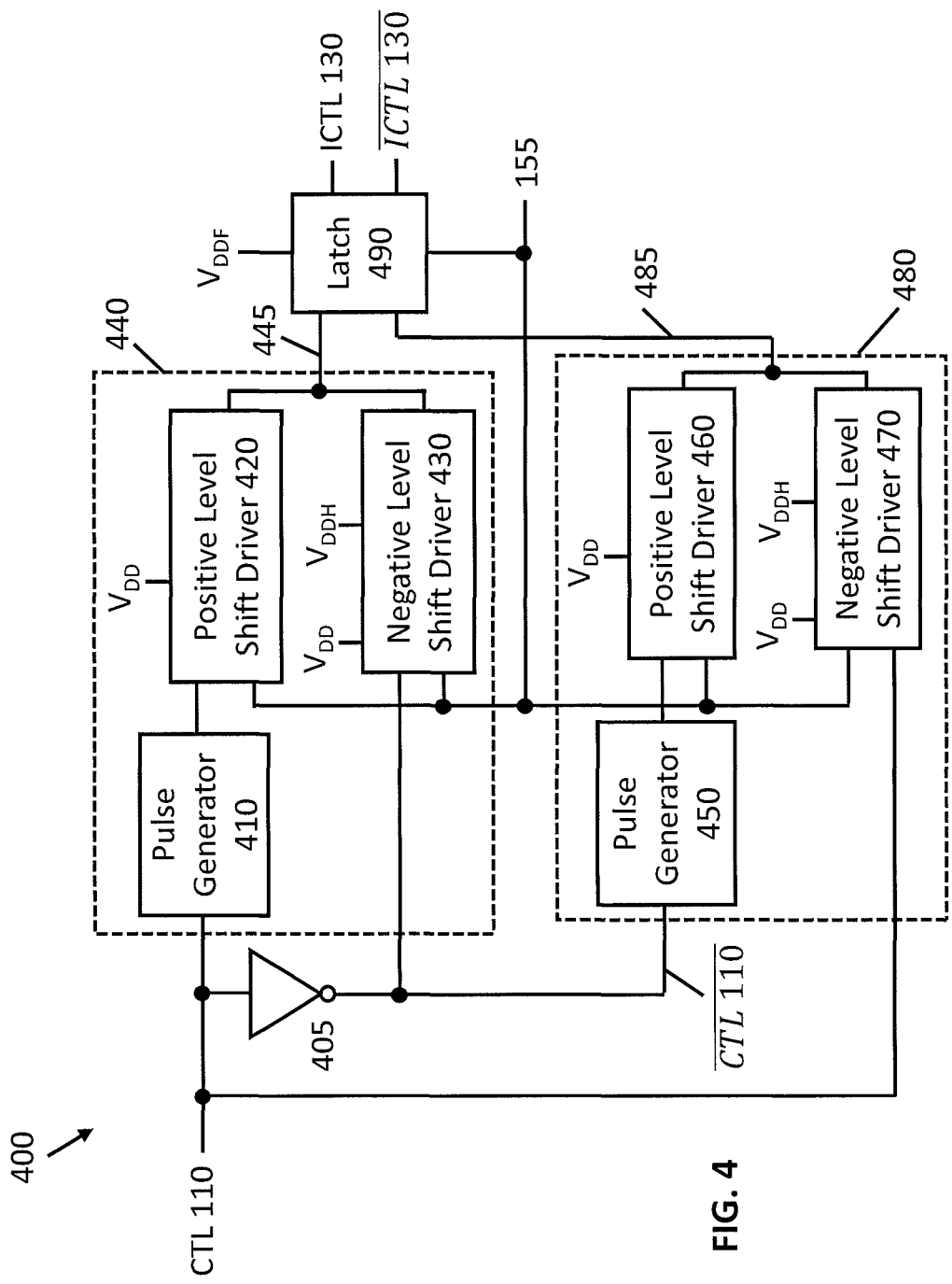
FIG. 4 illustrates a direct-coupled level shifter according to an exemplary embodiment of the present invention.

FIG. 4 illustrates a direct-coupled level shifter 400 according to an exemplary embodiment of the present invention. Direct-coupled level shifter 400 is described herein with reference to half bridge circuit 100 shown in FIG. 1 for ease of illustration, and includes two positive level shift drivers 420 and 460 and two negative level shift drivers 430 and 470. The positive level shift driver 420 and the negative level shift driver 470 receive CTL 110, and the positive level shift driver 460 and the negative level shift driver 430 receive the complement $\overline{CTL110}$ of CTL 110 from inverter 405. The first set of level shift drivers 440 includes positive level shift driver 420 which receives CTL 110 and negative level shift driver 430 which receives the complement $\overline{CTL110}$ and generates an output signal 445 for latch 490. The second set of level shift drivers 480 includes positive level shift driver 460 which receives the complement $\overline{CTL110}$ and negative level shift driver 470 which receives CTL 110 and generates an output signal 485 for latch 490. Advantageously, level shift drivers 440 and 480 do not require high voltage capacitors and their corresponding biasing circuits or high-speed differential amplifiers to generate ICTL 130 referenced from both positive and negative voltages on node 155, reducing the power consumption of direct-coupled level shifter 400 compared to the conventional capacitively coupled level shifter 300 shown in FIG. 3.

Latch 490 receives outputs 445 and 485 from sets 440 and 480 respectively, the floating supply voltage $V_{DDF}$, and the voltage on node 155. The floating supply voltage $V_{DDF}$ is approximately $V_{DD}-V_{120}+V_{IN}$, as discussed previously herein with reference to FIG. 1. Latch 490 outputs a control signal ICTL 130 and the complement $\overline{ICTL130}$ referenced from the voltage $V_{155}$ on node 155 to gate driver 140 based on the outputs 445 and 485 from sets 440 and 480 respectively. Latch 490 provides ICTL 130 and the complement $\overline{ICTL130}$ based on the outputs of the positive level shift drivers 420 and 460 when $V_{155}$ is positive or equal to ground 105. Conversely, latch 490 provides ICTL 130 and the complement $\overline{ICTL130}$ based on the outputs of the negative level shift drivers 430 and 470 when $V_{155}$ is negative. ICTL 130 is provided to the gate driver 140, and the complement $\overline{ICTL130}$ is available for use by other components in half bridge circuit 100 or other circuits on the semiconductor die including the half bridge circuit 100.

Positive level shift drivers 420 and 460 are ground referenced and receive the supply voltage $V_{DD}$ and $V_{155}$. Positive level shift drivers 420 and 460 generate the outputs 445 and 485 respectively for latch 490 when $V_{155}$ is above ground. If $V_{155}$ decreases below ground, positive level shift drivers 420 and 460 turn off. Negative level shift drivers 430 and 470 are referenced to both ground and to $V_{155}$ and receive the supply voltage $V_{DD}$ and a second supply voltage $V_{DDH}$. The second supply voltage $V_{DDH}$ is greater than or equal to the supply voltage $V_{DD}$, for example 12 volts (V) compared to 5V. Negative level shift drivers 430 and 470 generate the outputs 445 and 485 respectively for latch 490 while $V_{155}$ is negative. When $V_{155}$ increases above ground, negative level shift drivers 430 and 470 turn off.

$V_{155}$ is connected to positive level shift drivers 420 and 460 and used as a signal to prevent positive level shift drivers 420 and 460 from shorting to ground while $V_{155}$ is negative, which ensures direct-coupled level shifter 400 functions properly even while $V_{155}$ is negative. Pulse generators 410 and 450 reduce the current consumption of direct-coupled level shift driver 400 by causing positive level shift drivers 420 and 460 to generate the outputs 445 and 485 only in response to transitions in CTL 110 and the complement $\overline{CTL110}$. Pulse generators 410 and 450 receive CTL 110 and its complement $\overline{CTL110}$ respectively and generate short turn-on pulses for positive level shift drivers 420 and 460 in response to a high-to-low or low-to-high transition in CTL 110 and the complement $\overline{CTL110}$. Positive level shift drivers 420 and 460 then generate brief pulses in outputs 445 and 485 to change the state of latch 490.

Figure 2:
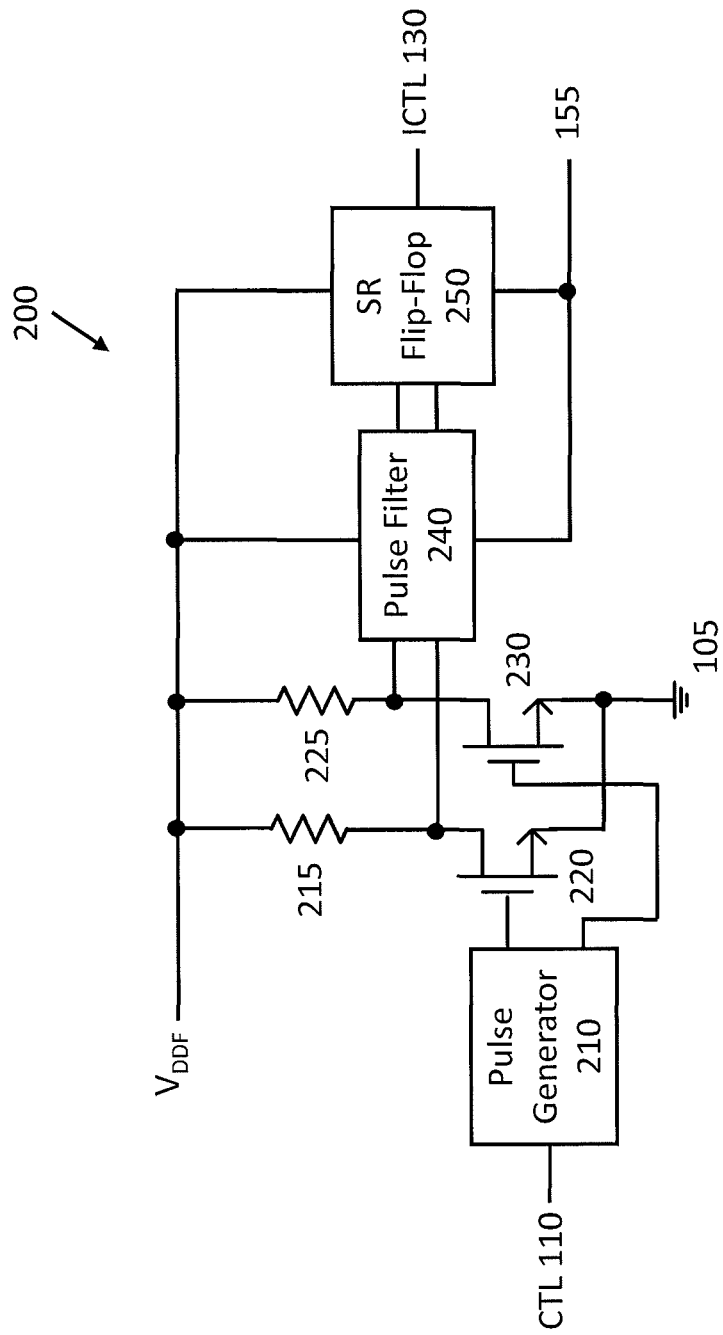
FIG. 2 illustrates a schematic of a conventional direct-coupled level shifter for a gate driver associated with a high side transistor in a half bridge circuit.

Optionally, negative level shift drivers 430 and 470 may also be connected to pulse generators 450 and 410, respectively, in response to $V_{155}$ being negative for more than a threshold period of time in order to further reduce current consumption of direct-coupled level shift driver 400. In other embodiments, none of the positive and negative level shift drivers 420, 430, 460, and 470 are connected to pulse generators. In some embodiments, a pulse filter and an SR flip-flop, such as pulse filter 240 and SR flip-flop 250 shown in FIG. 2, may be substituted for latch 490.

Figure 5:
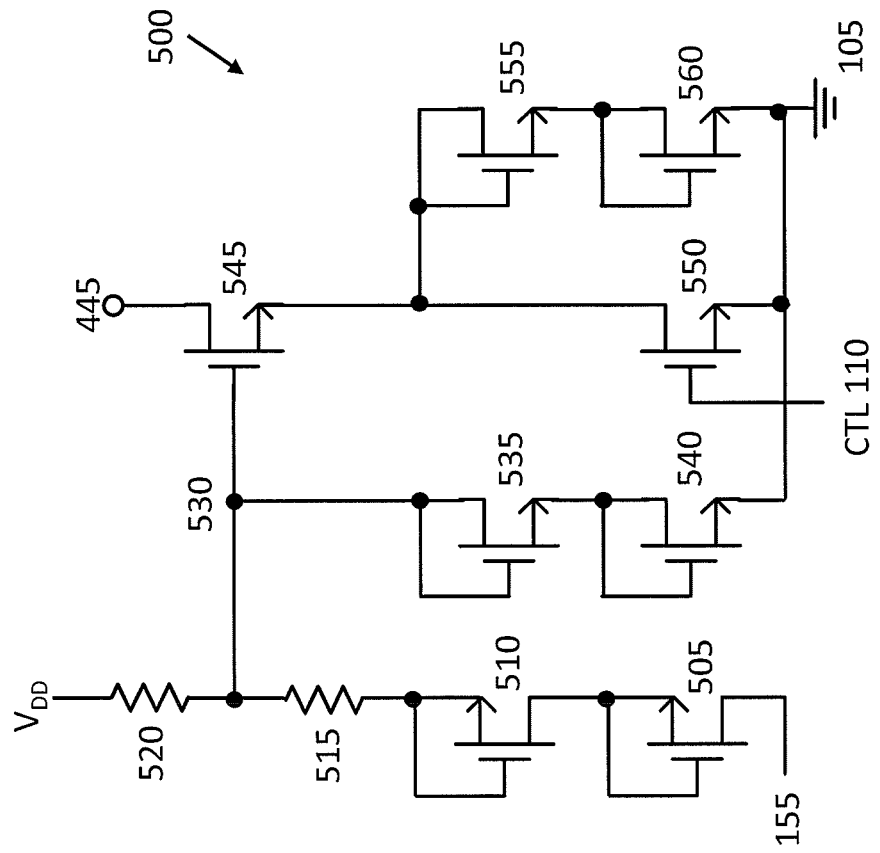
FIG. 5 illustrates a positive level shift driver according to an exemplary embodiment of the present invention for inclusion in the direct-coupled level shifter shown in FIG. 4.

FIG. 5 illustrates a positive level shift driver 500 according to an exemplary embodiment of the present invention for inclusion in the direct-coupled level shifter 400 shown in FIG. 4, such as for positive level shift driver 420 or 460. Positive level shift driver 500 is described herein with reference to half bridge circuit 100 shown in FIG. 1 and positive level shift driver 420 shown in FIG. 4 for ease of illustration. Positive level shift driver 500 includes GaN FET transistors 505-510 and 535-560 and resistors 515 and 520. Transistors 535, 540, 555, and 560 are configured as diodes and prevent the voltage on node 530 and the voltage on the source terminal of transistor 545 from increasing above a predetermined voltage in response to the voltage $V_{155}$ on node 155 and the voltage on the drain terminal of transistor 545 increasing to very high voltages. The predetermined voltage is chosen based on the voltage rating of transistor 545.

A difference between the voltage on node 530 and the voltage $V_{155}$ on node 155 is produced using resistor 515 and the set of transistors 505 and 510, which are configured as diodes. While $V_{155}$ is positive or equal to ground 105, the voltage on node 530 is sufficient to turn on transistor 545. In response to CTL 110 indicating that high side transistor 150 should be turned on, transistor 550 in the positive level shift driver 500 turns on and causes a current to be drawn through transistors 545 and 550. The current through transistors 545 and 550 is the output 445 generated by positive level shift driver 420 in direct-coupled level shifter 400. Positive level shift driver 500 is also used for positive level shift driver 460, in which case the gate terminal of transistor 550 receives the complement $\overline{CTL110}$, which causes transistor 550 to turn off and prevents current from being drawn through transistors 545 and 550. Thus, positive level shift driver 420 sinks current through transistors 545 and 550, while positive level shift driver 460 stops current from flowing through transistors 545 and 550. The current sinking output 445 and the current blocking output 485 causes latch 490 to output ICTL 130 indicating that high side transistor 150 should be turned on.

In response to CTL 110 indicating that high side transistor 150 should be turned off, transistor 550 in positive level shift driver 420 turns off and prevents current from being drawn through transistors 545 and 550. In positive level shift driver 460, the gate terminal of transistor 550 receives the complement $\overline{CTL110}$, which causes transistor 550 to turn on and draws current through transistors 545 and 550. The current through transistors 545 and 550 is the output 485 generated by positive level shift driver 460. Thus, positive level shift driver 420 stops current from flowing through transistors 545 and 550, while positive level shift driver 460 sinks current through transistors 545 and 550. The current blocking output 445 and the current sinking output 485 causes latch 490 to output ICTL 130, indicating that high side transistor 150 should be turned off.

As $V_{155}$ becomes negative, the voltage on node 530 decreases as well and causes transistor 545 to turn off slowly as $V_{155}$ decreases below a predetermined voltage set by the size of transistors 505 and 510 and the resistance of resistors 515 and 520. Because transistor 545 is turned off, output 445 for positive level shift driver 420, output 485 for positive level shift driver 460, and latch 490 are not shorted to ground 105 by transistor 550 and direct-coupled level shifter 400 continues to function properly.

Figure 6:
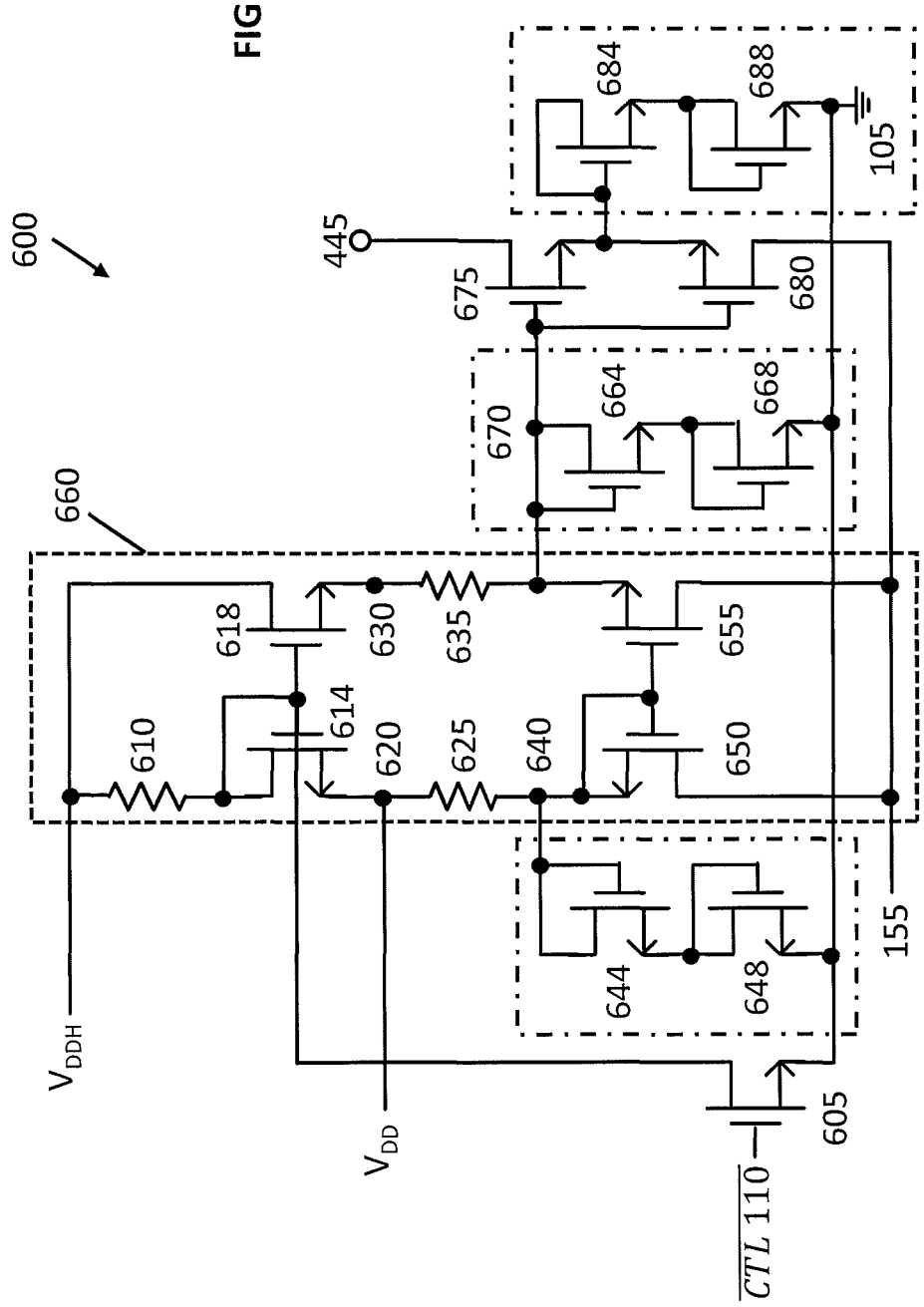
FIG. 6 illustrates a negative level shift driver according to an exemplary embodiment of the present invention for inclusion in the direct-coupled level shifter shown in FIG. 4.

FIG. 6 illustrates a negative level shift driver 600 according to an exemplary embodiment of the present invention for inclusion in the direct-coupled level shifter 400 shown in FIG. 4, such as for negative level shift driver 430 or 470. Negative level shift driver 600 is described herein with reference to half bridge circuit 100 shown in FIG. 1 and negative level shift driver 430 shown in FIG. 4 for ease of illustration. Negative level shift driver 600 includes a logic level translator 660 based on a current mirror to convert the ground-referenced complement $\overline{CTL110}$ from the lower supply voltage $V_{DD}$ into output 445 referenced to the negative $V_{155}$ and based on the secondary supply voltage $V_{DDH}$. Logic level translator 660 includes transistors 614, 618, 650, and 655 and resistors 610, 625, and 635. Resistors 625 and 635 have substantially the same resistance, transistor 614 is chosen to match transistor 618, and transistor 650 is chosen to match transistor 655.

While the complement $\overline{CTL110}$ is logic low, indicating that high side transistor 150 should be turned on, transistor 605 is turned off. The gate terminal of transistor 618 is biased by $V_{DDH}$, $V_{DD}$, resistor 610, and transistor 614. Because transistors 614 and 618 are substantially matched, the voltage on node 630 is substantially the same as $V_{DD}$. If $V_{155}$ is sufficiently lower than $V_{DD}$ such that transistors 650 and 655 operate in the saturation region, the voltage on node 670 is substantially the same as the voltage on node 640. The difference between the voltage on node 670 and $V_{155}$ is approximately the gate to source voltage $V_{GS}$ for transistor 650, which is sufficient to turn on transistors 675 and 680 and cause a current to be drawn through transistors 675 and 680. The current through transistors 675 and 680 is the output 445 generated by negative level shift driver 430 in direct-coupled level shifter 400. Negative level shift driver 600 outputs an inverse of the complement $\overline{CTL110}$, that is, CTL 110.

While the complement $\overline{CTL110}$ is logic high, indicating that high side transistor 150 should be turned off, transistor 605 is turned on and shorts the gate terminal of transistor 618 to ground 105. Even if $V_{155}$ has a high negative magnitude, the voltage on node 630 is negative and approximately a threshold voltage less than ground 105, which causes transistor 655 to operate in the triode region. The voltage on node 670 decreases below the voltage on node 640, and the difference between the voltage on node 670 and the voltage on node 155 is insufficient to turn on transistors 675 and 680, preventing current from being drawn through transistors 675 and 680.

Transistors 675 and 680 are shown as two transistors connected in series, but in other embodiments, a single transistor able to withstand large voltages on both the source and drain terminals may be used instead. Transistors 644, 648, 664, 668, 684, and 688 are configured as diodes and prevent the voltages on nodes 640 and 670 and the source terminals of transistors 675 and 680 from increasing above a predetermined voltage if $V_{155}$ and the current through transistors 675 and 680 increase to very high values. As $V_{155}$ becomes positive and increases above a threshold voltage for the transistors, current flowing through resistors 625 and 635 flows through transistors 644, 648, 664, and 668, rather than through transistors 650, 655, 675, and 680, which prevents negative level shift driver 600 from generating output 445 for latch 490. Negative level shift driver 600 may be used in place of negative level shift driver 470 as well, in which case the gate terminal of transistor 605 receives CTL 110, and the current through transistors 675 and 680 is the output 485.

Returning to direct-coupled level shifter 400 shown in FIG. 4, latch 490 receives outputs 445 and 485 from sets 440 and 480, each of which include a positive level shift driver, such as positive level shift driver 500 shown in FIG. 5, and a negative level shift driver, such as negative level shift driver 600 shown in FIG. 6. Table 1 illustrates the logic values of CTL 110, the inverse $\overline{CTL110}$, the outputs of positive level shift drivers 420 and 460 and negative level shift drivers 430 and 470, outputs 445 and 485, and ICTL 130, as well as the state of $V_{155}$ indicated by a plus sign for positive values and a minus sign for negative values. Conditions under which level shift drivers 420, 430, 460, and 470 do not generate outputs 445 or 485 are indicated with an X.

TABLE 1

| CTL 110 | $\overline{CTL\,110}$ | $V_{155}$ | 420 | 430 | 445 | 460 | 470 | 485 | ICTL 130 |
|---|---|---|---|---|---|---|---|---|---|
| 0 | 1 | + | 0; sinks current | X | 0 | 1; blocks current | X | 1 | 0 |
| 0 | 1 | − | X | 0; sinks current | 0 | X | 1; blocks current | 1 | 0 |
| 1 | 0 | + | 1; blocks current | X | 1 | 0; sinks current | X | 0 | 1 |
| 1 | 0 | − | X | 1; blocks current | 1 | X | 0; sinks current | 0 | 1 |

Output 445 comprises the output of positive level shift driver 420 if $V_{155}$ is positive and the output of negative level shift driver 430 if $V_{155}$ is negative. Output 485 comprises the output of positive level shift driver 460 if $V_{155}$ is positive and the output of negative level shift driver 470 if $V_{155}$ is negative. Latch 490 generates ICTL 130 based on the output 445 and the complement $\overline{ICTL130}$ based on the output 485.

Figure 7:
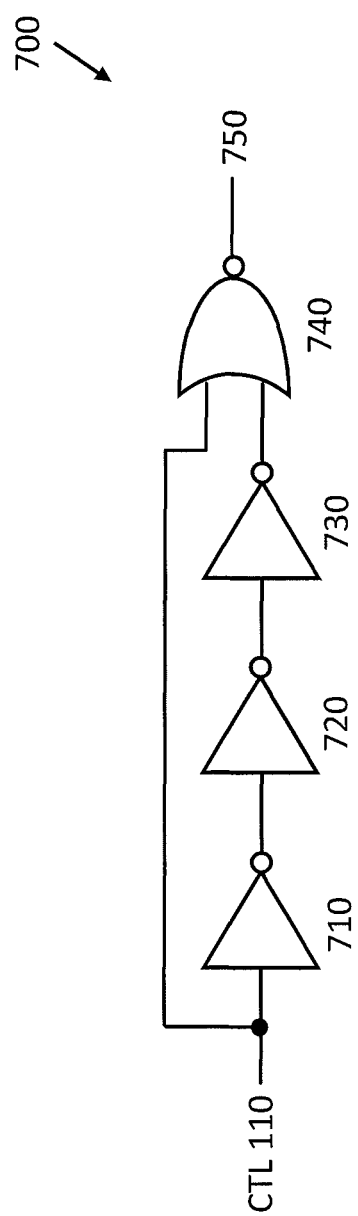
FIG. 7 illustrates a pulse generator for inclusion in the direct-coupled level shifter shown in FIG. 4.

FIG. 7 illustrates an exemplary pulse generator 700 for inclusion in the direct-coupled level shifter shown in FIG. 4, i.e., for pulse generator 410 or 450. Pulse generator 700 includes inverters 710, 720, and 730 and NOR logic gate 740. Inverter 710 and one input of NOR logic gate 740 receive CTL 110. Inverters 710, 720, and 730 delay and invert CTL 110, and NOR logic gate 740 outputs a logic high pulse 750 when both CTL 110 and the delayed and inverted control signal are logic low. Logic high pulse 750 is provided to one or more of the level shift drivers 420, 430, 460, and 470.

Figure 8:
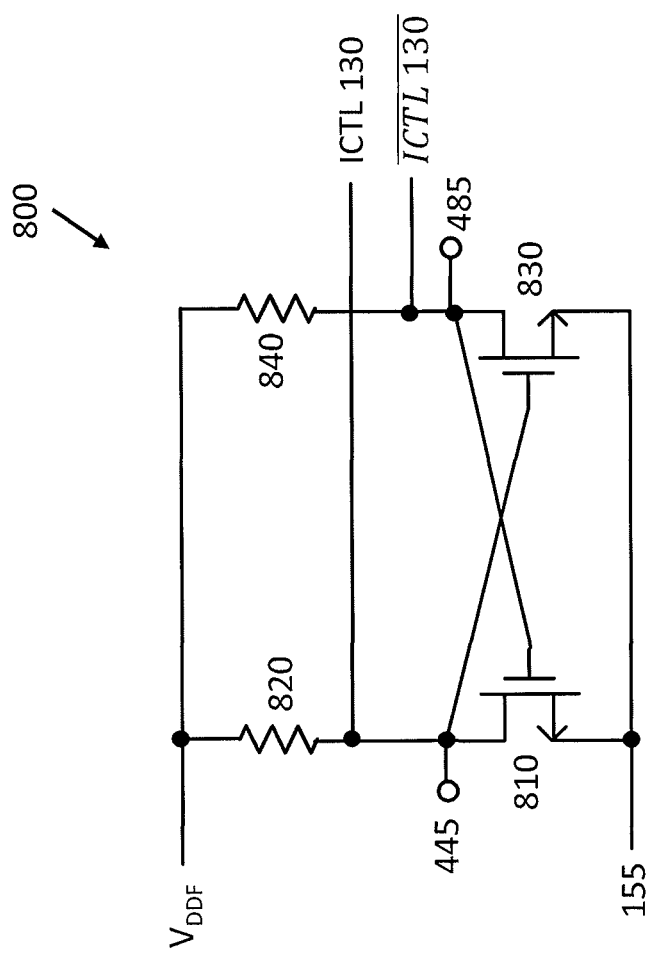
FIG. 8 illustrates a latch for inclusion in the direct-coupled level shifter shown in FIG. 4.

FIG. 8 illustrates an exemplary latch 800 for inclusion in the direct-coupled level shifter shown in FIG. 4, i.e., for latch 490. Transistor 810 receives $V_{155}$ on its source terminal, the output 485 from the set 480 of level shift drivers on its gate terminal, and the output 445 from the set 440 of level shift drivers on its drain terminal. Transistor 830 receives $V_{155}$ on its source terminal, the output 445 on its gate terminal, and the output 485 on its drain terminal. The drain terminal of transistor 810 is further connected to resistor 820, which is further connected to the floating supply voltage $V_{DDF}$. The drain terminal of transistor 830 is further connected to resistor 840, which is further connected to $V_{DDF}$. The output 445 can be used directly as ICTL 130. The output 485 can be used directly as the complement $\overline{ICTL130}$.

Table 2 illustrates the logic values of CTL 110, the inverse $\overline{CTL110}$, the outputs 445 and 485, the voltage of ICTL 130, the digital logic value of ICTL 130, the voltage of the complement $\overline{ICTL130}$, and the digital logic value of the complement $\overline{ICTL130}$, as well as the state of $V_{155}$ indicated by a plus sign for positive values and a minus sign for negative values and the state of transistors 810 and 830.

TABLE 2

| CTL 110 | $\overline{CTL}$ 110 | $V_{155}$ | 445 | 485 | 810 | 830 | Voltage of ICTL 130 | ICTL 130 | Voltage of $\overline{ICTL\,130}$ | $\overline{ICTL}$ 130 |
|---|---|---|---|---|---|---|---|---|---|---|
| 0 | 1 | + | 0 | 1 | On | Off | $V_{155}$ | 0 | $V_{DDF}$-$V_{485}$ | 1 |
| 0 | 1 | − | 0 | 1 | On | Off | $V_{155}$ | 0 | $V_{DDF}$-$V_{485}$ | 1 |
| 1 | 0 | + | 1 | 0 | Off | On | $V_{DDF}$-$V_{445}$ | 1 | $V_{155}$ | 0 |
| 1 | 0 | − | 1 | 0 | Off | On | $V_{DDF}$-$V_{445}$ | 1 | $V_{155}$ | 0 |

While transistor 810 is on and transistor 830 is off, the voltage of ICTL 130 is approximately $V_{155}$, logic low, and the voltage of the complement $\overline{ICTL\,130}$ is approximately $V_{DDF}$ minus the voltage $V_{485}$ of the output 485, logic high. While transistor 810 is off and transistor 830 is on, the voltage of ICTL 130 is approximately $V_{DDF}$ minus the voltage $V_{445}$ of the output 445, logic high, and the voltage of the complement $\overline{ICTL\,130}$ is approximately $V_{155}$, logic low. Latch 800 is an example realization of a latch; other embodiments of the level shifter include other implementations of a latch.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A direct-coupled level shifter for generating a level shifted control signal from a ground referenced control signal, comprising:
   a first set of level shift drivers for generating a first output and comprising a positive level shift driver configured to receive the control signal and a negative level shift driver configured to receive an inverse of the control signal; and
   a second set of level shift drivers for generating a second output and comprising a positive level shift driver configured to receive the inverse of the control signal and a negative level shift driver configured to receive the control signal,
   wherein:
   the positive level shift drivers in the first and second sets of level shift drivers are referenced to ground and are configured to generate the first and second outputs, respectively, if a reference voltage is positive, and turn off if the reference voltage is negative, and
   the negative level shift drivers in the first and second sets of level shift drivers are referenced to ground and the reference voltage and are configured to generate the first and second outputs, respectively, if the reference voltage is negative, and turn off if the reference voltage is positive.

2. The direct-coupled level shifter of claim 1, further comprising a latch circuit for receiving the first output and providing the level shifted control signal based on the first output.

3. The direct-coupled level shifter of claim 2, wherein the latch circuit is further configured to receive the second output and provide an inverse of the level shifted control signal based on the second output.

4. The direct-coupled level shifter of claim 1, further comprising:
   a pulse filter for receiving the first output and providing an output; and
   an SR flip-flop for receiving the output of the pulse filter and providing the level shifted control signal.

5. The direct-coupled level shifter of claim 4, wherein the pulse filter is further configured to receive the second output and provide a second output, and wherein the SR flip-flop receives the second output of the pulse filter and provides an inverse of the level shifted control signal.

6. The direct-coupled level shifter of claim 1, wherein each of the first and second sets of level shift drivers further comprises a pulse generator for generating a short pulse in response to a logic signal transition in the control signal or the inverse of the control signal, respectively.

7. The direct-coupled level shifter of claim 1, further comprising an inverter for generating the inverse of the control signal.

8. The direct-coupled level shifter of claim 1, wherein the positive level shift driver comprises:
   a first set of at least one gallium nitride (GaN) field effect transistor (FET) configured as a diode and connected in series for receiving the reference voltage;
   a first resistor having a first terminal connected to the first set of GaN FETs and a second terminal connected to a node;
   a second resistor having a first terminal connected to the node and a second terminal configured to receive a supply voltage;
   a first GaN FET having a gate terminal connected to the node, a source terminal, and a drain terminal, wherein the first resistor and the first set of GaN FETs are configured to produce a voltage difference between the reference voltage and a voltage on the node sufficient to turn on the first GaN FET if the reference voltage is positive; and
   a second GaN FET for allowing or blocking the first output based on the control signal or the second output based on the inverse of the control signal, respectively, and having a drain terminal connected to the source terminal of the first GaN FET, a source terminal, and a gate terminal for receiving the control signal or the inverse of the control signal, respectively.

9. The direct-coupled level shifter of claim 8, wherein the positive level shift driver further comprises:
   a second set of at least one GaN FET configured as a diode and connected in series, the second set of GaN FETs further connected to the node and configured to keep a voltage on the node less than a first predetermined voltage; and
   a third set of at least one GaN FET configured as a diode and connected in series, the third set of GaN FETs further connected to the source terminal of the first GaN FET and the drain terminal of the second GaN FET, wherein the third set of GaN FETs are configured to keep a voltage on the source terminal of the first GaN FET and the drain terminal of the second GaN FET less than a second predetermined voltage.

10. The direct-coupled level shifter of claim 1, wherein the negative level shift driver comprises:

a first gallium nitride (GaN) field effect transistor (FET) for allowing or blocking the first output based on the inverse of the control signal or the second output based on the control signal, respectively, and having a drain terminal, a source terminal, and a gate terminal for receiving the inverse of the control signal or the control signal, respectively;

a logic level translator connected to the drain terminal of the first GaN FET and configured to receive the reference voltage, a first supply voltage, and a second supply voltage, wherein the second supply voltage is greater than or equal to the first supply voltage, wherein the logic level translator is further connected to a node; and a second FET having a source terminal for receiving the reference voltage, a drain terminal, and a gate terminal connected to the node, wherein the logic level translator is configured to produce a voltage difference between the reference voltage and a voltage on the node sufficient to turn on the second FET in response to the reference voltage being less than a predetermined voltage and based on the inverse of the control signal or the control signal, respectively.

11. The direct-coupled level shifter of claim 10, wherein the second FET is a GaN FET and wherein the negative level shift driver further comprises a third GaN FET having a drain terminal for receiving the reference voltage, a source terminal connected to the source terminal of the second FET, and a gate terminal connected to the node.

12. The direct-coupled level shifter of claim 11, wherein the negative level shift driver further comprises:
a set of at least one GaN FET configured as diodes and connected in series, the set of GaN FETs further connected to the source terminals of the second FET and the third GaN FET, wherein the set of GaN FETs are configured to keep a voltage on the source terminals of the second FET and the third GaN FET less than a predetermined value.

13. The direct-coupled level shifter of claim 10, wherein the logic level translator comprises:
a first resistor having a first terminal for receiving the second supply voltage and a second terminal;
a third GaN FET having a gate terminal and a drain terminal connected to the second terminal of the first resistor and a source terminal for receiving the first supply voltage;

a second resistor having a first terminal connected to the source terminal of the third GaN FET and receiving the first supply voltage and a second terminal;
a fourth GaN FET having a gate terminal and a source terminal connected to the second terminal of the second resistor and a drain terminal for receiving the reference voltage;
a fifth GaN FET having a gate terminal connected to the second terminal of the first resistor and the gate and drain terminals of the third GaN FET, a drain terminal for receiving the second supply voltage, and a source terminal;
a third resistor having a first terminal connected to the source terminal of the fifth GaN FET and a second terminal connected to the node; and
a sixth GaN FET having a gate terminal connected to the second terminal of the second resistor and the gate and source terminals of the fourth GaN FET, a drain terminal for receiving the reference voltage, and a source terminal connected to the node, wherein a voltage difference between the reference voltage and a voltage on the node is sufficient to turn on the second FET in response to the first GaN FET being in an off state and the reference voltage being sufficiently less than the first supply voltage such that the fourth and sixth GaN FETs operate in the saturation region.

14. The direct-coupled level shifter of claim 13, wherein a resistance of the second resistor and a resistance of the third resistor are substantially the same, wherein the third and fifth GaN FETs are matched, and wherein the fourth and sixth GaN FETs are matched.

15. The direct-coupled level shifter of claim 13, wherein the negative level shift driver further comprises:
a first set of at least one GaN FET configured as a diode and connected in series, the first set of GaN FETs further connected to the second terminal of the second resistor, the gate and source terminals of the fourth GaN FET, and the gate terminal of the sixth GaN FET; and
a second set of at least one GaN FET configured as a diode and connected in series, the second set of GaN FETs further connected to the node, wherein the first and second sets of GaN FETs cause the negative level shift driver to turn off if the reference voltage increases above a threshold voltage for the GaN FETs.

* * * * *